Figure 1:
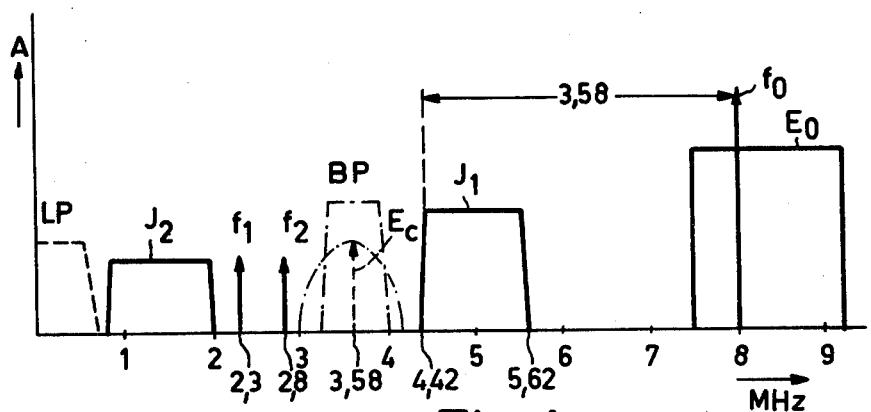

United States Patent [19]

de Boer

[11] 4,141,033
[45] Feb. 20, 1979

[54] DEVICE FOR AUTOMATICALLY CONTROLLING THE ASYMMETRY OF A SIGNAL

[75] Inventor: Eeltje de Boer, Eindhoven, Netherlands

[73] Assignee: U.S. Philips Corporation, New York, N.Y.

[21] Appl. No.: 827,062

[22] Filed: Aug. 23, 1977

[30] Foreign Application Priority Data

May 24, 1977 [NL] Netherlands .......................... 7705667

[51] Int. Cl.² .......................... H04N 5/84; H03K 5/04
[52] U.S. Cl. .............................................. 358/7; 358/8; 358/130; 328/58; 328/164
[58] Field of Search .................... 358/4, 7, 8, 127, 128, 358/130; 360/33, 36, 25, 30, 38; 332/18; 328/34, 58, 164

[56] References Cited

U.S. PATENT DOCUMENTS

| | | | |
|---|---|---|---|
| 3,988,531 | 10/1976 | Laub | 358/127 |
| 3,988,532 | 10/1976 | Korpel | 358/127 |

Primary Examiner—John C. Martin
Attorney, Agent, or Firm—Frank R. Trifari; Simon L. Cohen

[57] ABSTRACT

When a color television signal is recorded on a video disc and said signal is read a complication arises owing to the asymmetry which is produced in the signal by the various process steps. This gives rise to spurious components whose influence should be minimized by a suitably selected coding system. The invention proposes a device with which the influence of this asymmetry is automatically reduced. This device comprises two separator stages for supplying two sub-signals which respectively represent the rising and falling edges of the information signal. The phase relationship between these two sub-signals is controlled with the aid of a phase shifter. The control signal required for this is produced with the aid of a detector which responds to an asymmetry component in the information signal. The two corrected sub-signals are subsequently recombined to the information signal.

8 Claims, 3 Drawing Figures

DEVICE FOR AUTOMATICALLY CONTROLLING THE ASYMMETRY OF A SIGNAL

The invention relates to a device for processing an information signal, in particular a video signal, which comprises at least a frequency modulated carrier wave.

Frequency modulation is a modulation technique which is widely used for the transmission of information. For example, when information is to be recorded on a record carrier this modulation technique plays an important part. This is in particular so for recording video signals, for which purpose a multitude of coding systems exist which, taking into account the specific properties and imperfections of the record carrier which is used, serve to record the various signal components of the video signal in a most effective manner.

For an example of such a coding system reference is made to an article in the magazine "IEEE transactions on consumer electronics; November 1976, no. 4, pages 309 ff." This article describes a coding system for use in a recording and/or playback system with a so-called optical video disc. Such a disc comprises a spiral track in which the complete video signal is recorded in a sequence of pits and intermediate areas, which track can be scanned optically during read-out.

The coding system described in said article is based on a standard television signal. The combination of luminance and chrominance signal contained in the standard television signal is directly added to a carrier wave as a frequency modulation. The sound signals which are modulated on two sub-carriers are then added to the said frequency-modulated carrier wave as a pulse-width modulation.

As is stated in said article it has been found that during read-out of such an optical video disc undesired signal components may occur, which may affect the quality of the reproduced picture. Furthermore, it has been found that certain spurious signals are produced by asymmetrical components which are introduced in the various process steps during manufacture of the video disc and during read-out of said disc. In this respect asymmetry is to be understood to mean a variation of the relative pulse width of the signal, which for the information track on the disc results in an incorrect ratio between the length of the pits and the length of the intermediate areas. This asymmetry may inter alia arise during the photographic development of the master disc and during pressing of the replicas. In the case of a frequency-modulated signal which in itself has a relative pulse width (duty cycle) of 50%, i.e. positive and negative half-cycles of equal duration, these process steps may for example give rise to a signal with a relative pulse width of 45%. The read process may also introduce an undesired asymmetry component. It is to be noted that obviously the said pulse-width modulation of the modulated FM carrier by the sound signals also gives rise to an asymmetry caused by the various process steps.

In order to minimize the influence of the spurious signals as a result of this undesired asymmetry, the frequencies of the various carrier waves are selected so that the spurious components caused by the asymmetry have frequencies which as far as possible lie outside the frequency bands occupied by the desired signal components. In order to achieve this the carrier wave frequencies have to be shifted towards higher values, as is evident from the cited article. However, as a result of this the requirements in respect of the bandwidth of the transmission medium, i.e. the record carrier, become more stringent, which may inter alia result in a reduction of the storage capacity of the record carrier, i.e. the playing time.

It is an object of the invention to provide a device which enables the influence of the asymmetry on a transmission system to be reduced. The device in accordance with the invention is therefore characterized in that the device is provided with a control circuit for controlling an asymmetry component contained in the information signal, which control circuit comprises:

a first separating stage for deriving a first sub-signal from the information signal, which first sub-signal only represents the rising edges of the information signal, a second separating stage for deriving a second sub-signal from the information signal, which second sub-signal only represents the falling edges of the information signal, a detector for detecting the asymmetry component in the information signal and deriving a control signal therefrom, a phase shifter for controlling the phase relationship between the first and the second sub-signal depending on the control signal, and a recombination circuit for, after this control of the phase-relationship, recombining the first and the second sub-signal to a corrected information signal whose consecutive edges are sequentially defined by the first and the second sub-signal.

The device in accordance with the invention can be used both during recording and during playback of the video disc. If the total asymmetry produced during recording and playback of the video signal is predictable, the device in accordance with the invention enables an opposite asymmetry to be introduced into the video signal. Similarly, the device in accordance with the invention may be used during read-out of the record carrier in order to compensate for any undesired asymmetry then prevailing. Obviously, these two possibilities may be combined.

A preferred embodiment of the invention is characterized in that the phase shifter comprises a first delay means for delaying the first sub-signal and a second delay means for delaying the second sub-signal, at least one of said delay means having a delay time which is variable depending on the control signal.

A further preferred embodiment of the invention is characterized in that the detector comprises a low-pass filter to which the information signal is applied.

The detector may take various forms which will be described in more detail with reference to the Figures.

The invention will now be described in more detail with reference to the drawing, in which FIG. 1 for the purpose of illustration shows the frequency spectrum of a video signal such as can be recorded on a video disc.

Figure 2:
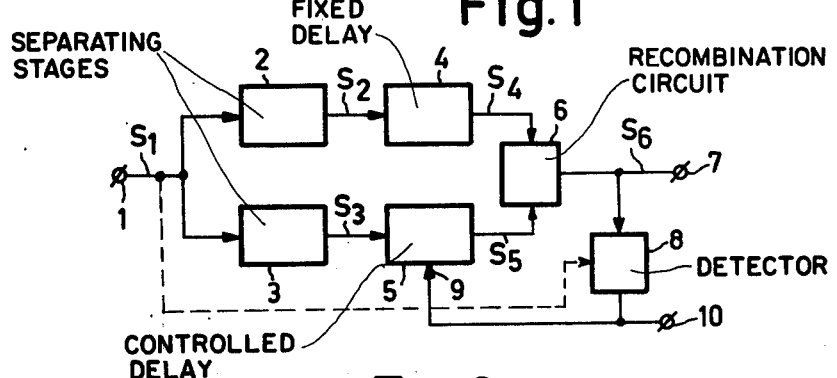
Figure 3:
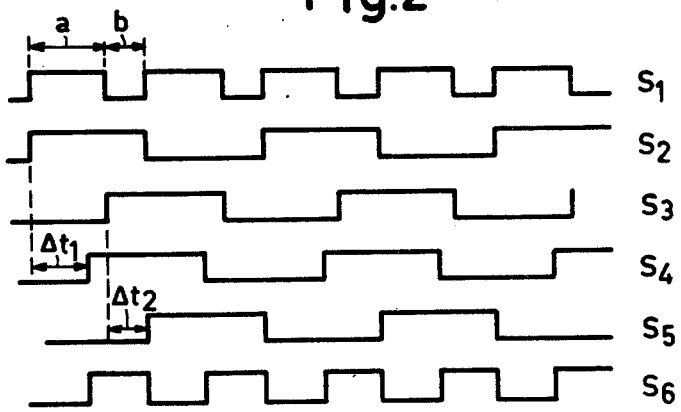

FIG. 2 schematically represents the device in accordance with the invention, and FIG. 3 represents the associated signals.

FIG. 1 shows the frequency spectrum of the video signal obtainable with the so-called NTSC composite coding system, i.e. the coding system in which the luminance and the chrominance signal of a standard NTSC colour television signal are jointly added to a carrier wave $f_o$ as a frequency modulation. It is assumed that the carrier wave $f_o = 8$ MHz corresponds to the blanking level of the luminance signal. The frequency sweep $E_o$ runs from 7.5 MHz (peak sync.) to 9.2 MHz (peak white). The first-order lower side band $J_1$ of the chrominance signal lies at distance of 3.58 MHz, the standard chrominance sub-carrier frequency, from the instantaneous frequency of the FM signal and thus occupies a frequency band between 4.42 MHz and 5.62 MHz. The second-order lower side band $J_2$ in its turn lies 3.58 MHz below this. Two sound signals are modulated on two carrier waves $f_1 = 2.3$ MHz and $f_2 = 2.8$ MHz, i.e. in the case of an optical video disc they are added to the frequency-modulated signal as a pulse-width modulation, for example in a manner as described in U.S. Pat. No. 3,893,163.

If the video signal is subjected to a process step causing an asymmetry, one of the main spurious components is the cross product $E_c$ of the frequency modulated carrier wave $E_o$ and the first-order lower side band $J_1$ of the chrominance signal. The frequency of this cross product $E_c$ is consequently 3.58 MHz. From the Figure it is readily apparent that if said cross product $E_c$ is not to affect the first-order lower side band $J_1$ of the chrominance signal, there should be a reasonable frequency spacing (approx. 1 MHz) between the two signals, which means that the minimum frequency of the carrier wave $f_o$ is then $1+2\times3.58 \approx 8$ MHz. This frequency defines the required speed for the video disc in combination with the minimum and maximum read diameter and thus the maximum playing time.

The device in accordance with the invention is schematically shown in FIG. 2 and the associated signals in FIG 3. The device comprises an input terminal 1 to which the coded video signal $S_1$ is applied. It is assumed that this signal $S_1$ has two signal levels. Furthermore, it is assumed for the sake of simplicity that the sound signals are zero, so that they do not produce any modulation of the relative pulse width of the frequency-modulated signal. Consequently, the signal $S_1$ would have to be symmetrical, i.e. $a = b$, but this is not the case owing to an asymmetrical process step.

The signal $S_1$ is applied to a first and a second separating state 2 and 3. The purpose of these two separating states 2 and 3 is to obtain two sub-signals $S_2$ and $S_3$ which respectively represent the rising and falling edges of the signal $S_1$. For this purpose use can for example be made of a differentiator, which supplies positive and negative pulses respectively corresponding to the rising and falling edges of the signal $S_1$ and which can for example be separated with the aid of level detectors.

For FIG. 2 and the associated signal waveforms of FIG. 3 a different version of these separating stages 2 and 3 is used, namely simple frequency dividers are used, i.e. a bistable multivibrator 2 which is triggered by the rising edges of the signal $S_1$ and a bistable multivibrator 3 which is triggered by the falling edges of the signal $S_1$. The sub-signal $S_2$ consequently has edges corresponding to the rising edge of the signal $S_1$, while the subsignal $S_2$ has edges which correspond to the falling edges of the signal $S_1$.

The sub-signal $S_2$ is applied to a delay means 4, which introduces a delay $\Delta t_1$, resulting in a sub-signal $S_4$. The sub-signal $S_3$ is applied to a delay means 5 which introduces a delay $\Delta t_2$ which is determined by a control signal at a control input 9 of this delay means and which supplies a sub-signal $S_5$. It is obvious that for the delay means use can be made of analog shift registers, but also of logic circuits such as monostable multivibrators with a variable reset time. Which version is selected will inter alia depend on the shape of the signals $S_2$ and $S_3$. The two sub-signals $S_4$ and $S_5$ are recombined to a signal $S_6$ with the aid of the circuit 6, which may for example consist of an exclusive-OR circuit. This recombined signal $S_6$ is then available at an output terminal 7. The design of the recombination circuit obviously depends on the shape of the two sub-signals $S_4$ and $S_5$.

Moreover, the signal $S_6$ is applied to a detector 8 which detects the degree of asymmetry in this signal $S_6$ and derives the control signal for the delay means 5 therefrom. In the example shown in FIG. 3 it is assumed that the sound signals $f_1$ and $f_2$ are zero and that a symmetrical output signal $S_6$ is desired. In that case the detector 8 will be adapted so that the control signal supplied to the delay means 5 introduces such a delay time $\Delta t2$ that the edges of the sub-signal $S_5$ appear exactly halfway those of the sub-signal $S_4$, so that the recombined signal $S_6$ is perfectly symmetrical. This control method is employed for reading the record carrier.

When the device in accordance with the invention is used for recording on the record carrier it may be desirable to introduce a certain degree of asymmetry so as to compensate for the predictable asymmetry produced by the subsequent process steps. Obviously, this can be achieved by giving the control signal certain bias.

The detector 8 may take various forms. As a first possibility a low-pass filter may be mentioned. This low-pass filter generally should not cover a frequency band in which desired signal components are present and in the frequency spectrum of FIG. 1 it may for example cover the frequency band designated LP. With the aid of this low-pass filter the relevant low-frequency component in the signal $S_6$ is then measured, so that the asymmetry component manifecting itself in this frequency band can be controlled. Generally, it is the very asymmetry caused by the process steps during development of a video disc which falls within this frequency band. The pulse width modulation (asymmetry) caused by the sound carriers $f_1$ and $f_2$ lie outside this low-pass band and are consequently preserved.

A second possibility for the detector 8 is the combination of a band-pass filter and amplitude detector. The band-pass filter should then be adjusted to a frequency corresponding to the frequency of a spurious component caused by the asymmetry, in FIG. 1 for example a pass-band BP around the spurious component $E_c$. The amplitude of this spurious component is a measure of the asymmetry and after detection provides the control signal. A second spurious component which is suitable to provide the control signal after amplitude detection is twice the carrier frequency $2f_c$. It is obvious that in fact any spurious component caused by the asymmetry or combinations thereof may be used for detection.

The example shown in FIG. 2 is a closed control loop, because the detector 8 is connected to the output terminal 7. It is equally possible to connect this detector 8 to the input terminal 1, as indicated by the dashed line in FIG. 2.

When the device in accordance with the invention is used in a read apparatus for a record carrier, a special embodiment can be obtained if the detector 8 also comprises a band-pass filter with a frequency pass-band which covers the modulated sound carriers $f_1$ and $f_2$. The control signal supplied by this detector 8 will then contain a component situated within this frequency band, which component represents these two modulated sound carrier waves $f_1$ and $f_2$. With the aid of an output terminal 10 and a band-pass filter coupled thereto having a pass-band around these carrier frequencies, these modulated sound carriers $f_1$ and $f_2$ can be extracted. The output signal $S_6$ on the terminal 7 then only contains the video information, because the sound signals have been removed therefrom by means of the control system.

What is claimed is:

1. A device for controlling an asymmetrical component in an information signal which contains at least a frequency modulated carrier wave, which control circuit comprises:
   a first separating stage means for deriving a first sub-signal from the information signal, which first sub-signal only represents the rising edges of the information signal,
   a second separating stage means for deriving a second sub-signal from the information signal which second sub-signal only represents the falling edges of the information signal,
   a detector means for detecting the asymmetry component in the information signal and for deriving a control signal therefrom,
   a phase shifter means for controlling the phase relationship between the first and the second sub-signal depending on the control signal, and
   a recombination circuit means for recombining the first and second phase controlled sub-signals to provide a corrected information signal whose consecutive edges are sequentially defined by the first and second phase controlled sub-signals.

2. A device as claimed in claimed in claim 1, wherein the first and the second separating stage means respectively comprises a first and a second frequency divider stage means for supplying the first and the second sub-signal respectively, the first sub-signal having consecutive edges corresponding to the rising edges of the information signal and the second sub-signal having consecutive edges corresponding to the falling edges of this information signal.

3. A device as claimed in claim 1, wherein the phase shifter means comprises a first delay means for delaying the first sub-signal and a second delay means for delaying the second sub-signal, at least one of said delay means having a delay time which is variable depending on the control signal.

4. A device as claimed in claim 1, wherein the detector comprises a low-pass filter to which the information signal is applied.

5. A device as claimed in claim 3, wherein the corrected information signal is applied to the detector means.

6. A device as claimed in claim 1, wherein the detector means is adapted to measure the amplitude of a spurious component produced by the asymmetry component.

7. A device as claimed in claim 5 for processing an information signal which comprises a composite color television signal which is frequency modulated on a carrier wave, wherein the detector is adapted to measure the amplitude of a spurious component which has a frequency equal to the subcarrier frequency of the chrominance signal contained in the composite color television signal.

8. A device as claimed in claim 5, wherein the detector is adapted to measure the amplitude of a spurious component with a frequency equal to twice the frequency of the modulated carrier wave.

* * * * *